United States Patent
Sommer

(10) Patent No.: US 7,925,936 B1
(45) Date of Patent: Apr. 12, 2011

(54) MEMORY DEVICE WITH NON-UNIFORM PROGRAMMING LEVELS

(75) Inventor: Naftali Sommer, Rishon Le-Zion (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 316 days.

(21) Appl. No.: 12/171,797

(22) Filed: Jul. 11, 2008

Related U.S. Application Data

(60) Provisional application No. 60/949,515, filed on Jul. 13, 2007, provisional application No. 61/022,343, filed on Jan. 20, 2008.

(51) Int. Cl.
*G06F 11/00* (2006.01)
*G11C 29/00* (2006.01)

(52) U.S. Cl. ......... 714/704; 714/718; 714/723; 714/746

(58) Field of Classification Search .................. 714/704, 714/718, 723, 736, 746; 365/200, 201, 189.011, 365/185.33
See application file for complete search history.

(56) References Cited

U.S. PATENT DOCUMENTS

| | | | |
|---|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,172,338 A | 12/1992 | Mehrotra et al. |
| 5,191,584 A | 3/1993 | Anderson |
| 5,200,959 A | 4/1993 | Gross et al. |

(Continued)

FOREIGN PATENT DOCUMENTS

EP 0783754 B1 7/1997

(Continued)

OTHER PUBLICATIONS

Jedec Standard JESD84-C44, "Embedded MultiMediaCard (e•MMC) Mechanical Standard, with Optional Reset Signal", Jedec Solid State Technology Association, USA, Jul. 2009.

(Continued)

*Primary Examiner* — Phung M Chung
(74) *Attorney, Agent, or Firm* — Knobbe Martens Olson & Bear LLP

(57) ABSTRACT

A method for storing data in a memory, which includes a plurality of analog memory cells, includes defining programming levels that represent respective combinations of at least first and second bits and are represented by respective nominal storage values. The data is stored by mapping the data to storage values selected from among the nominal storage values and writing the storage values to the memory cells. A condition is defined over two or more bit-specific error rates applicable respectively to at least the first and second bits. The bit-specific error rates include a first bit-specific error rate computed over the data stored by the first bits and a second bit-specific error rate computed, separately from the first bit-specific error rate, over the data stored by the second bits. The nominal storage values are set based on the bit-specific error rates so as to meet the condition.

34 Claims, 5 Drawing Sheets

U.S. PATENT DOCUMENTS

| | | |
|---|---|---|
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A * | 5/1995 | Shirai .............................. 360/46 |
| 5,416,782 A | 5/1995 | Wells et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,541,886 A | 7/1996 | Hasbun |
| 5,600,677 A | 2/1997 | Citta et al. |
| 5,657,332 A | 8/1997 | Auclair et al. |
| 5,675,540 A | 10/1997 | Roohparvar |
| 5,682,352 A | 10/1997 | Wong et al. |
| 5,696,717 A | 12/1997 | Koh |
| 5,726,649 A | 3/1998 | Tamaru et al. |
| 5,742,752 A | 4/1998 | De Koning |
| 5,751,637 A | 5/1998 | Chen et al. |
| 5,761,402 A | 6/1998 | Kaneda et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,429 A * | 2/1999 | Chen et al. ............... 365/185.33 |
| 5,877,986 A | 3/1999 | Harari et al. |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,991,517 A | 11/1999 | Harari et al. |
| 5,995,417 A | 11/1999 | Chen et al. |
| 6,009,014 A | 12/1999 | Hollmer et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,166,962 A | 12/2000 | Chen et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,275,419 B1 | 8/2001 | Guterman et al. |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,396,742 B1 | 5/2002 | Korsh et al. |
| 6,397,364 B1 | 5/2002 | Barkan |
| 6,405,323 B1 | 6/2002 | Lin et al. |
| 6,418,060 B1 | 7/2002 | Yong et al. |
| 6,442,585 B1 | 8/2002 | Dean et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,558,967 B1 | 5/2003 | Wong |
| 6,560,152 B1 | 5/2003 | Cernea |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,643,169 B2 | 11/2003 | Rudelic et al. |
| 6,678,192 B2 | 1/2004 | Gongwer et al. |
| 6,687,155 B2 | 2/2004 | Nagasue |
| 6,707,748 B2 | 3/2004 | Lin et al. |
| 6,708,257 B2 | 3/2004 | Bao |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |
| 6,809,964 B2 | 10/2004 | Moschopoulos et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,894,926 B2 | 5/2005 | Guterman et al. |
| 6,907,497 B2 | 6/2005 | Hosono et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 7,002,843 B2 | 2/2006 | Guterman et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,151,692 B2 | 12/2006 | Wu |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |
| 7,200,062 B2 | 4/2007 | Kinsely et al. |

| | | | | | | |
|---|---|---|---|---|---|---|
| 7,221,592 | B2 | 5/2007 | Nazarian | 2005/0169051 A1 * | 8/2005 | Khalid et al. ............ 365/185.03 |
| 7,224,613 | B2 | 5/2007 | Chen et al. | 2005/0189649 A1 | 9/2005 | Maruyama et al. |
| 7,231,474 | B1 | 6/2007 | Helms et al. | 2005/0213393 A1 | 9/2005 | Lasser |
| 7,231,562 | B2 | 6/2007 | Ohlhoff et al. | 2005/0224853 A1 | 10/2005 | Ohkawa |
| 7,243,275 | B2 | 7/2007 | Gongwer et al. | 2005/0240745 A1 | 10/2005 | Iyer et al. |
| 7,254,690 | B2 | 8/2007 | Rao | 2005/0243626 A1 | 11/2005 | Ronen |
| 7,257,027 | B2 | 8/2007 | Park | 2006/0004952 A1 | 1/2006 | Lasser |
| 7,259,987 | B2 | 8/2007 | Chen et al. | 2006/0028875 A1 | 2/2006 | Avraham et al. |
| 7,266,026 | B2 | 9/2007 | Gongwer et al. | 2006/0028877 A1 | 2/2006 | Meir |
| 7,274,611 | B2 | 9/2007 | Roohparvar | 2006/0101193 A1 | 5/2006 | Murin |
| 7,277,355 | B2 | 10/2007 | Tanzawa | 2006/0107136 A1 | 5/2006 | Gongwer et al. |
| 7,280,398 | B1 | 10/2007 | Lee et al. | 2006/0129750 A1 | 6/2006 | Lee et al. |
| 7,280,409 | B2 | 10/2007 | Misumi et al. | 2006/0133141 A1 | 6/2006 | Gorobets |
| 7,289,344 | B2 | 10/2007 | Chen | 2006/0156189 A1 | 7/2006 | Tomlin |
| 7,301,807 | B2 | 11/2007 | Khalid et al. | 2006/0179334 A1 | 8/2006 | Brittain et al. |
| 7,301,817 | B2 | 11/2007 | Li et al. | 2006/0203546 A1 | 9/2006 | Lasser |
| 7,308,525 | B2 | 12/2007 | Lasser et al. | 2006/0218359 A1 | 9/2006 | Sanders et al. |
| 7,310,255 | B2 | 12/2007 | Chan | 2006/0221705 A1 | 10/2006 | Hemink et al. |
| 7,310,272 | B1 | 12/2007 | Mokhlesi et al. | 2006/0221714 A1 | 10/2006 | Li et al. |
| 7,310,347 | B2 * | 12/2007 | Lasser .......................... 370/412 | 2006/0239077 A1 | 10/2006 | Park et al. |
| 7,321,509 | B2 | 1/2008 | Chen et al. | 2006/0256620 A1 | 11/2006 | Nguyen et al. |
| 7,342,831 | B2 | 3/2008 | Mokhlesi et al. | 2006/0256626 A1 | 11/2006 | Werner et al. |
| 7,345,928 | B2 | 3/2008 | Li | 2006/0256891 A1 | 11/2006 | Yuan et al. |
| 7,349,263 | B2 | 3/2008 | Kim et al. | 2006/0271748 A1 | 11/2006 | Jain et al. |
| 7,356,755 | B2 | 4/2008 | Fackenthal | 2006/0285392 A1 | 12/2006 | Incarnati et al. |
| 7,363,420 | B2 | 4/2008 | Lin et al. | 2006/0285396 A1 | 12/2006 | Ha |
| 7,397,697 | B2 | 7/2008 | So et al. | 2007/0006013 A1 | 1/2007 | Moshayedi et al. |
| 7,408,804 | B2 | 8/2008 | Hemink et al. | 2007/0019481 A1 | 1/2007 | Park |
| 7,409,473 | B2 | 8/2008 | Conley et al. | 2007/0033581 A1 | 2/2007 | Tomlin et al. |
| 7,420,847 | B2 | 9/2008 | Li | 2007/0047314 A1 | 3/2007 | Goda et al. |
| 7,433,231 | B2 | 10/2008 | Aritome | 2007/0047326 A1 | 3/2007 | Nguyen et al. |
| 7,437,498 | B2 | 10/2008 | Ronen | 2007/0050536 A1 | 3/2007 | Kolokowsky |
| 7,440,324 | B2 | 10/2008 | Mokhlesi | 2007/0058446 A1 | 3/2007 | Hwang et al. |
| 7,441,067 | B2 | 10/2008 | Gorobetz et al. | 2007/0061502 A1 | 3/2007 | Lasser et al. |
| 7,453,737 | B2 | 11/2008 | Ha | 2007/0067667 A1 | 3/2007 | Ikeuchi et al. |
| 7,460,410 | B2 | 12/2008 | Nagai et al. | 2007/0074093 A1 | 3/2007 | Lasser |
| 7,460,412 | B2 | 12/2008 | Lee et al. | 2007/0086239 A1 | 4/2007 | Litsyn et al. |
| 7,466,592 | B2 | 12/2008 | Mitani et al. | 2007/0086260 A1 | 4/2007 | Sinclair |
| 7,468,911 | B2 | 12/2008 | Lutze et al. | 2007/0089034 A1 | 4/2007 | Litsyn et al. |
| 7,471,581 | B2 | 12/2008 | Tran et al. | 2007/0091677 A1 | 4/2007 | Lasser et al. |
| 7,492,641 | B2 | 2/2009 | Hosono et al. | 2007/0091694 A1 | 4/2007 | Lee et al. |
| 7,508,710 | B2 | 3/2009 | Mokhlesi | 2007/0103978 A1 | 5/2007 | Conley et al. |
| 7,539,062 | B2 | 5/2009 | Doyle | 2007/0103986 A1 | 5/2007 | Chen |
| 7,551,492 | B2 | 6/2009 | Kim | 2007/0109845 A1 | 5/2007 | Chen |
| 7,570,520 | B2 | 8/2009 | Kamei et al. | 2007/0109849 A1 | 5/2007 | Chen |
| 7,593,259 | B2 | 9/2009 | Kim et al. | 2007/0118713 A1 | 5/2007 | Guterman et al. |
| 7,596,707 | B1 | 9/2009 | Vemula | 2007/0143378 A1 | 6/2007 | Gorobets |
| 7,631,245 | B2 | 12/2009 | Lasser | 2007/0143531 A1 | 6/2007 | Atri |
| 7,633,802 | B2 | 12/2009 | Mokhlesi | 2007/0159889 A1 | 7/2007 | Kang et al. |
| 7,656,734 | B2 | 2/2010 | Thorp et al. | 2007/0159892 A1 | 7/2007 | Kang et al. |
| 7,660,158 | B2 | 2/2010 | Aritome | 2007/0159907 A1 | 7/2007 | Kwak |
| 7,660,183 | B2 | 2/2010 | Ware et al. | 2007/0168837 A1 | 7/2007 | Murin |
| 7,742,351 | B2 | 6/2010 | Inoue et al. | 2007/0171714 A1 | 7/2007 | Wu et al. |
| 7,885,119 | B2 | 2/2011 | Li | 2007/0183210 A1 | 8/2007 | Choi et al. |
| 2001/0002172 | A1 | 5/2001 | Tanaka et al. | 2007/0189073 A1 | 8/2007 | Aritome |
| 2001/0006479 | A1 | 7/2001 | Ikehashi et al. | 2007/0195602 A1 | 8/2007 | Fong et al. |
| 2002/0038440 | A1 | 3/2002 | Barkan | 2007/0206426 A1 | 9/2007 | Mokhlesi |
| 2002/0118574 | A1 | 8/2002 | Gongwer et al. | 2007/0208904 A1 | 9/2007 | Hsieh et al. |
| 2002/0174295 | A1 | 11/2002 | Ulrich et al. | 2007/0226599 A1 | 9/2007 | Motwani |
| 2002/0196510 | A1 | 12/2002 | Hietala et al. | 2007/0236990 A1 | 10/2007 | Aritome |
| 2003/0002348 | A1 | 1/2003 | Chen et al. | 2007/0253249 A1 | 11/2007 | Kang et al. |
| 2003/0103400 | A1 | 6/2003 | Van Tran | 2007/0256620 A1 | 11/2007 | Viggiano et al. |
| 2003/0161183 | A1 | 8/2003 | Tran | 2007/0266232 A1 | 11/2007 | Rodgers et al. |
| 2003/0189856 | A1 | 10/2003 | Cho et al. | 2007/0271424 A1 | 11/2007 | Lee et al. |
| 2004/0057265 | A1 | 3/2004 | Mirabel et al. | 2007/0280000 A1 | 12/2007 | Fujiu et al. |
| 2004/0057285 | A1 | 3/2004 | Cernea et al. | 2007/0291571 A1 | 12/2007 | Balasundaram |
| 2004/0083333 | A1 | 4/2004 | Chang et al. | 2008/0010395 A1 | 1/2008 | Mylly et al. |
| 2004/0083334 | A1 | 4/2004 | Chang et al. | 2008/0025121 A1 | 1/2008 | Tanzawa |
| 2004/0105311 | A1 | 6/2004 | Cernea et al. | 2008/0043535 A1 | 2/2008 | Roohparvar |
| 2004/0114437 | A1 | 6/2004 | Li | 2008/0049504 A1 | 2/2008 | Kasahara et al. |
| 2004/0160842 | A1 | 8/2004 | Fukiage | 2008/0049506 A1 | 2/2008 | Guterman |
| 2005/0007802 | A1 | 1/2005 | Gerpheide | 2008/0052446 A1 | 2/2008 | Lasser et al. |
| 2005/0013165 | A1 | 1/2005 | Ban | 2008/0055993 A1 | 3/2008 | Lee |
| 2005/0024941 | A1 | 2/2005 | Lasser et al. | 2008/0080243 A1 | 4/2008 | Edahiro et al. |
| 2005/0024978 | A1 | 2/2005 | Ronen | 2008/0082730 A1 | 4/2008 | Kim et al. |
| 2005/0086574 | A1 | 4/2005 | Fackenthal | 2008/0089123 A1 | 4/2008 | Chae et al. |
| 2005/0121436 | A1 | 6/2005 | Kamitani et al. | 2008/0104309 A1 | 5/2008 | Cheon et al. |
| 2005/0157555 | A1 | 7/2005 | Ono et al. | 2008/0104312 A1 * | 5/2008 | Lasser ......................... 711/103 |
| 2005/0162913 | A1 | 7/2005 | Chen | 2008/0109590 A1 | 5/2008 | Jung et al. |

| | | | |
|---|---|---|---|
| 2008/0115017 A1 | 5/2008 | Jacobson | |
| 2008/0123420 A1 | 5/2008 | Brandman et al. | |
| 2008/0126686 A1 | 5/2008 | Sokolov et al. | |
| 2008/0130341 A1 | 6/2008 | Shalvi et al. | |
| 2008/0148115 A1 | 6/2008 | Sokolov et al. | |
| 2008/0151618 A1 | 6/2008 | Sharon et al. | |
| 2008/0151667 A1 | 6/2008 | Miu et al. | |
| 2008/0158958 A1 | 7/2008 | Sokolov et al. | |
| 2008/0181001 A1 | 7/2008 | Shalvi | |
| 2008/0198650 A1 | 8/2008 | Shalvi et al. | |
| 2008/0209116 A1 | 8/2008 | Caulkins | |
| 2008/0209304 A1 | 8/2008 | Winarski et al. | |
| 2008/0215798 A1 | 9/2008 | Sharon et al. | |
| 2008/0219050 A1* | 9/2008 | Shalvi et al. | 365/185.03 |
| 2008/0239093 A1 | 10/2008 | Easwar et al. | |
| 2008/0239812 A1 | 10/2008 | Abiko et al. | |
| 2008/0263262 A1 | 10/2008 | Sokolov et al. | |
| 2008/0282106 A1* | 11/2008 | Shalvi et al. | 714/6 |
| 2009/0024905 A1 | 1/2009 | Shalvi et al. | |
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1 | 3/2009 | Lee et al. | |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0199074 A1 | 8/2009 | Sommer et al. | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0142277 A1 | 6/2010 | Yang et al. | |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 2007046084 A2 | 4/2007 |
| WO | 2007132456 A2 | 11/2007 |
| WO | 2007132458 A2 | 11/2007 |
| WO | WO 2007/132452 A2 | 11/2007 |
| WO | WO 2007/132453 A2 | 11/2007 |
| WO | WO 2007/132457 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Jedec, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
U.S. Appl. No. 11/949,135 Official Action dated Oct. 2, 2009.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
Bez et al. "Introduction to Flash Memory." Proceedings of the *IEEE*. 91(4):489-502 (2003).
Cho et al. "A 3.3V 1Gb Multi-Level NAND Flash Memory with Non-Uniform Threshold Voltage Distribution." IEEE International Solid-State Circuits Conference (ISSCC), San Francisco, CA, Feb. 5-7, 2001, pp. 28-29 and 424.
Eitan et al. "Multilevel Flash Cells and their Trade-Offs." Proceedings of the 1996 IEEE IEDM, New York, 169-172.
Eitan et al. "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pp. 522-524.
Kim and Koh. "Future Memory Technology including Emerging New Memories." Proceedings of the 24th Internaitonal Conference on Microelectronics (MIEL), Nis, Serbia and Montenegro, May 16-19, 2004, vol. 1, pp. 377-384.
Maayan et al. "A 512 Mb NROM Flat Data Storage Memory with 8 MB/s Data Rate." Proceedings of the 2992 IEEE International Solid-State Circuits Conference (ISSCC 2002), San Francisco, California, Feb. 3-7, 2002, pp. 100-101.
Agrell et al., "Closest Point Search in Lattices", IEEE Transactions on Information Theory, vol. 48, No. 8, pp. 2201-2214, Aug. 2002.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Lee et al., "Effects of Floating Gate Interference on NAND Flash Memory Cell Operation", IEEE Electron Device Letters, vol. 23, No. 5, pp. 264-266, May 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.

U.S. Appl. No. 12/045,520 Official Action dated Nov. 16, 2010.

U.S. Appl. No. 12/880,101 "Reuse of Host Hibernation Storage Space by Memory Controller", filed Sep. 12, 2010.

U.S. Appl. No. 12/890,724 "Error Correction Coding Over Multiple Memory Pages", filed Sep. 27, 2010.

Numonyx, "M25PE16: 16-Mbit, page-erasable serial flash memory with byte-alterability, 75 MHz SPI bus, standard pinout", Apr. 2008.

U.S. Appl. No. 12/497,707 Official Action dated Sep. 15, 2010.

U.S. Appl. No. 11/995,801 Official Action dated Oct. 15, 2010.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action date May 20, 2010.

Shalvi et al., U.S. Appl. No. 12/822,207 "Adaptive Over-Provisioning in Memory Systems" filed Jun. 24, 2010.

U.S. Appl. No. 11/995,814 Official Action dated Dec. 17, 2010.

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director ARTICLE BASE, posted Sep. 5, 2009.

UBUNTU Forums, "Memory Stick Failed IO Superblock", posted Nov. 11, 2009.

SUPER USER Forums, "SD Card Failure, can't read superblock", posted Aug. 8, 2010.

U.S. Appl. No. 12/987,174 filed on Jan. 10, 2011.

U.S. Appl. No. 12/987,175 filed on Jan. 10, 2011.

U.S. Appl. No. 12/963,649 filed on Dec. 9, 2010.

U.S. Appl. No. 13/021,754 filed on Feb. 6, 2011.

US 7,161,836, 01/2007, Wan et al. (withdrawn)

* cited by examiner

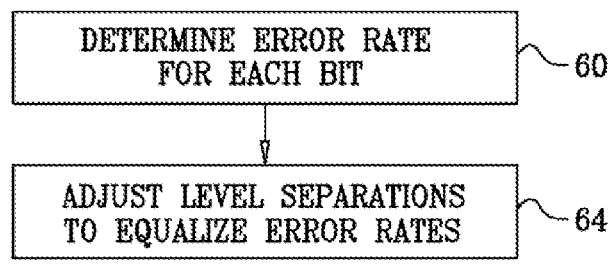
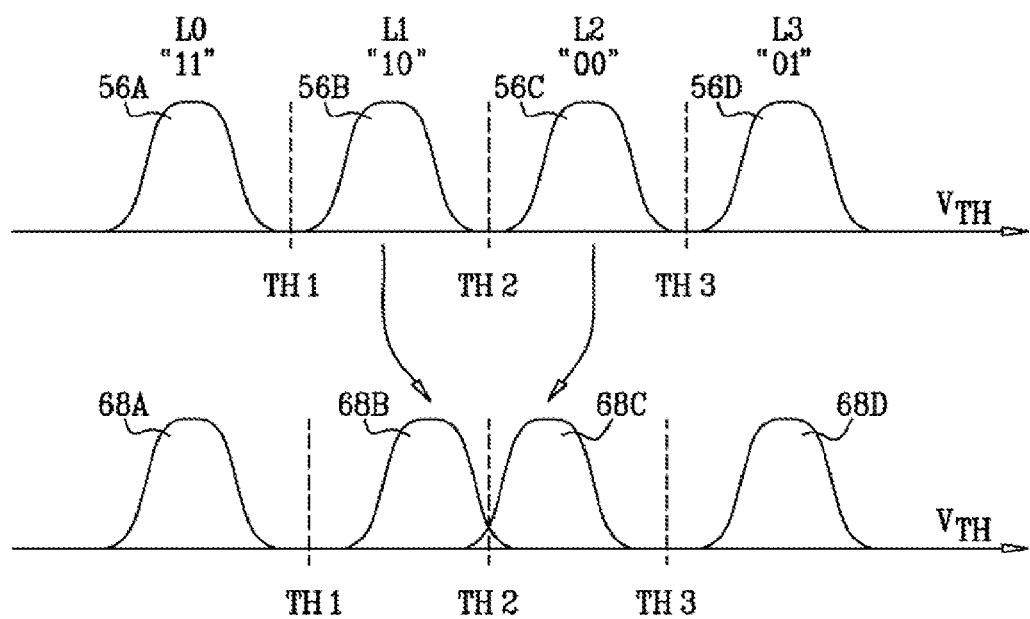

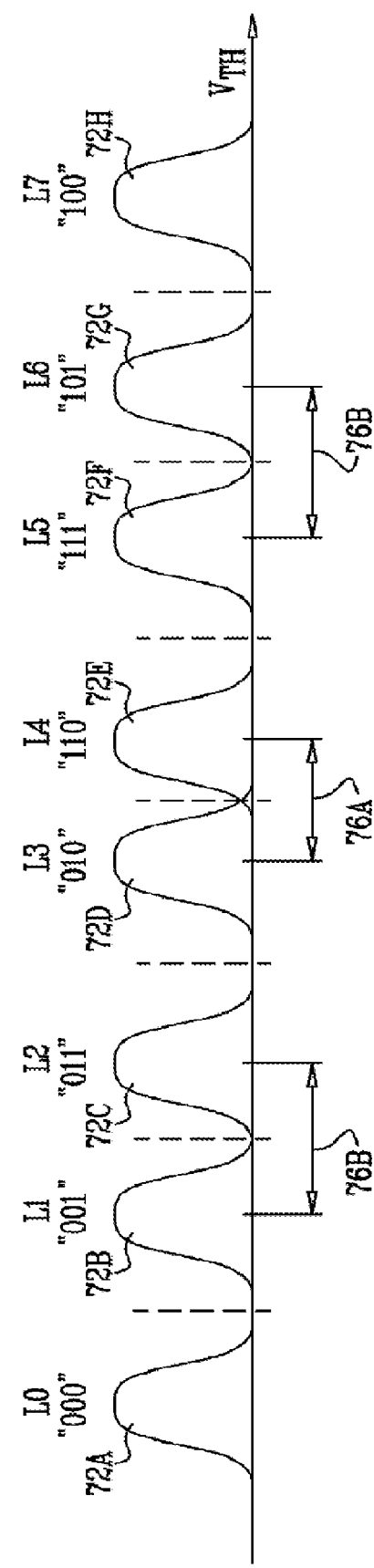

MEMORY DEVICE WITH NON-UNIFORM PROGRAMMING LEVELS

CROSS-REFERENCE TO RELATED APPLICATIONS

This application claims the benefit of U.S. Provisional Patent Application 60/949,515, filed Jul. 13, 2007 and U.S. Provisional Patent Application 61/022,343, filed Jan. 20, 2008, whose disclosures are incorporated herein by reference.

FIELD OF THE INVENTION

The present invention relates generally to memory devices, and particularly to memory devices having non-uniform programming levels.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Cho at al., describe a multi-level Flash device having non-uniform threshold voltage distributions in "Multi-Level NAND Flash Memory with Non-Uniform Threshold Voltage Distribution," IEEE International Solid-State Circuits Conference (ISSCC), San Francisco, Calif., Feb. 5-7, 2001, pages 28-29 and 424, which is incorporated herein by reference. The threshold voltage distributions of the device are non-uniform and are designed to account for various impairments such as adjacent word line interference, program disturbance, floating gate disturbance and charge loss.

SUMMARY OF THE INVENTION

Embodiments of the present invention provide a method for storing data in a memory that includes a plurality of analog memory cells, the method including:

defining a set of programming levels that represent respective combinations of at least first and second bits and are represented by respective nominal storage values;

storing the data in the memory by mapping the data to storage values selected from among the nominal storage values and writing the storage values to the memory cells;

defining a condition over two or more bit-specific error rates applicable respectively to at least the first and second bits, wherein the bit-specific error rates include a first bit-specific error rate computed over the data stored by the first bits in the memory cells and a second bit-specific error rate computed, separately from the first bit-specific error rate, over the data stored by the second bits in the memory cells; and setting the nominal storage values based on the bit-specific error rates so as to meet the condition.

In some embodiments, the condition states that the two or more bit-specific error rates are equal to one another. In another embodiment, the condition states that the two or more bit-specific error rates are do not exceed respective two or more target error rates. In yet another embodiment, setting the nominal storage values includes maximizing a spacing among the nominal storage values within a maximum allowed range of the storage values. Alternatively, setting the nominal storage values may include minimizing a range occupied by the storage values.

In a disclosed embodiment, setting the nominal storage values includes estimating the bit-specific error rates for an initial setting of the nominal storage values, evaluating the condition responsively to the estimated bit-specific error rates, and modifying the nominal storage values so as to meet the condition. Estimating the bit-specific error rates may include reading second storage values from the cells, reconstructing the data by processing the read second storage values, detecting bit errors in the reconstructed data and calculating the bit-specific error rates responsively to the detected bit errors.

In an embodiment, storing the data includes encoding the data with an Error Correction Code (ECC), reconstructing the data includes decoding the ECC, and detecting the bit errors includes comparing the reconstructed data before decoding the ECC with the reconstructed data after decoding the ECC.

In another embodiment, when one of the bit-specific error rates is to be increased with respect to the other bit-specific error rates in order to meet the condition, modifying the nominal storage values includes identifying a pair of the programming levels, such that a read error between the identified pair of the programming levels contributes to the one of the bit-specific error rates, and reducing a spacing between a pair of the nominal storage values that are associated with the identified pair of the programming levels.

In yet another embodiment, when one of the bit-specific error rates is to be reduced with respect to the other bit-specific error rates in order to meet the condition, modifying the nominal storage values includes identifying a pair of the programming levels, such that a read error between the identified pair of the programming levels contributes to the one of the bit-specific error rates, and increasing a spacing between a pair of the nominal storage values that are associated with the identified pair of the programming levels.

In still another embodiment, estimating the bit-specific error rates, evaluating the condition and modifying the nominal storage values include running a computerized simulation that simulates the memory and produces the nominal storage values. Alternatively, estimating the bit-specific error rates, evaluating the condition and modifying the nominal storage values may be performed when the memory is operating in a host system.

In some embodiments, storing the data includes encoding the data with an Error Correction Code (ECC), and the bit-specific error rates include at least one error rate type selected from a group of types consisting of a pre-ECC error rate measured before decoding the ECC and a post-ECC error rate measured after decoding the ECC. In an embodiment, the data is partitioned into memory pages, and each of the at least first and second bits stores a respective different memory page.

In another embodiment, the method includes reading second storage values from the cells and canceling a distortion in at least some of the second storage values, and setting the nominal storage values includes setting the nominal storage values so as to meet the condition with respect to the second storage values in which the distortion was canceled. In yet another embodiment, the condition is further defined over a throughput of reading the data from the memory, and setting the nominal storage values includes setting the values responsively to the throughput.

There is additionally provided, in accordance with an embodiment of the present invention, a data storage apparatus, including:

a memory, which includes a plurality of analog memory cells;

read/write (R/W) circuitry, which is coupled to accept a definition of a set of programming levels that represent respective combinations of at least first and second bits and are represented by respective nominal storage values, and to store the data in the memory by mapping the data to storage values selected from among the nominal storage values and writing the storage values to the memory cells; and a processor, which is configured to define a condition over two or more bit-specific error rates applicable respectively to at least the first and second bits, wherein the bit-specific error rates include a first bit-specific error rate computed over the data stored by the first bits in the memory cells and a second bit-specific error rate computed, separately from the first bit-specific error rate, over the data stored by the second bits in the memory cells, and to set the nominal storage values based on the bit-specific error rates so as to meet the condition.

There is also provided, in accordance with an embodiment of the present invention, a data storage apparatus, including:

an interface, which is coupled to communicate with a memory that includes a plurality of analog memory cells; and a processor, which is connected to the interface and is configured to define a set of programming levels that represent respective combinations of at least first and second bits and are represented by respective nominal storage values, to store the data in the memory by mapping the data to storage values selected from among the nominal storage values and writing the storage values to the memory cells, to define a condition over two or more bit-specific error rates applicable respectively to at least the first and second bits, wherein the bit-specific error rates include a first bit-specific error rate computed over the data stored by the first bits in the memory cells and a second bit-specific error rate computed, separately from the first bit-specific error rate, over the data stored by the second bits in the memory cells, and to set the nominal storage values based on the bit-specific error rates so as to meet the condition.

There is further provided, in accordance with an embodiment of the present invention, a memory, including:

a plurality of analog memory cells; and read/write (R/W) circuitry, which is coupled to accept a set of nominal storage values, which correspond to respective programming levels representing respective combinations of at least first and second bits, and to store the data in the memory by mapping the data to storage values selected from among the nominal storage values and writing the storage values to the memory cells, wherein the nominal storage values meet a condition, which is defined over two or more bit-specific error rates applicable respectively to at least the first and second bits, wherein the bit-specific error rates include a first bit-specific error rate computed over the data stored by the first bits in the memory cells and a second bit-specific error rate computed, separately from the first bit-specific error rate, over the data stored by the second bits in the memory cells.

The present invention will be more fully understood from the following detailed description of the embodiments thereof, taken together with the drawings in which:

BRIEF DESCRIPTION OF THE DRAWINGS

FIG. 3 is a flow chart that schematically illustrates a method for setting non-uniform programming levels in a group of analog memory cells, in accordance with an embodiment of the present invention;

FIGS. 4 and 5 are graphs showing non-uniform programming levels in a group of analog memory cells, in accordance with embodiments of the present invention.

DETAILED DESCRIPTION OF EMBODIMENTS

Overview

Figure 1:
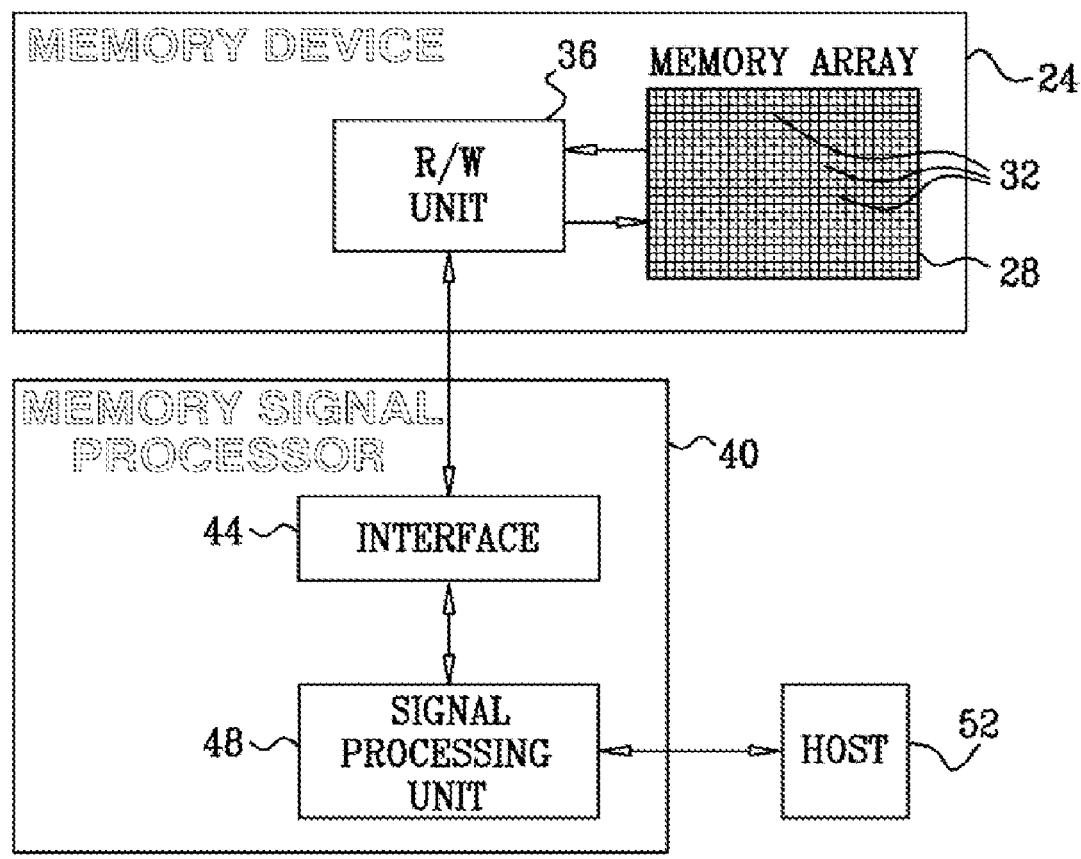
FIG. 1 is a block diagram that schematically illustrates a memory system, in accordance with an embodiment of the present invention.

In a typical MLC configuration, each memory cell stores two or more data bits, and the cells are read by comparing their threshold voltages to a set of reference levels. A read error occurs when the threshold voltage of a given cell falls on the wrong side of a reference level and is therefore associated with the wrong programming level. Read errors are most likely to occur between adjacent programming levels. When the assignment of bit values to programming levels uses "Gray coding," each read error between adjacent levels affects only a single bit.

Since the number of possible error events that affect each bit may not be the same for each MLC bit, different bits may have different Bit Error Rates (BERs). In some memory configurations, different MLC bits may be mapped to different memory pages, and therefore different pages may have different BERs. Uneven BER is often undesirable, for example because it increases the maximum possible number of errors per page. When the stored data is encoded with an Error Correcting Code (BCC), the capability of the ECC decoder is typically designed for the worst-case pages, and therefore the uneven BER complicates the ECC decoder and reduces the error correction capability of the code. In pages other than the worst-case pages, the ECC redundancy is often over-specified.

Embodiments of the present invention that are described hereinbelow provide methods and systems for controlling the BER of different MLC bits. The methods and systems described herein use the fact that, for a given pair of adjacent programming levels, the likelihood of read errors increases as the separation between the levels decreases, and vice versa. Therefore, the error rate associated with each pair of adjacent programming levels can be controlled by adjusting the separation between them.

In the methods and systems described herein, a memory system comprises an array of multi-level analog memory cells, and Read/Write (R/W) circuitry that programs and reads the cells. The R/W circuitry programs the cells with programming levels that are spaced non-uniformly on the voltage axis. The BERs associated with the different MLC bits are adjusted by controlling the spacing between programming levels. In configurations that use Gray coding, each bit-specific BER can be controlled irrespective of other BERs. In other configurations, several BERs are controlled jointly. The BER adjustment process may be performed a-priori, i.e., during the design of the memory system, and/or at any stage along the lifetime of the system.

In some embodiments, the programming levels are spaced so that the BERs associated with the different bits are approximately equal to one another. When different bits are mapped to different memory pages, the spacing may thus be adjusted so that each page has approximately the same BER. As a result, the maximum possible number of errors per page decreases, and the ECC correction capability can be improved accordingly. Alternatively, the programming levels can be spaced so as to achieve different target BERs for the different bits, or in order to meet other kinds of conditions. Several examples of non-uniform programming level configurations for four-level and eight-level MLC are described herein.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and CTF Flash cells, PCM, NROM, FRAM, MRAM and DRAM cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. The R/W unit typically programs the cells using an iterative Program and Verify (P&N) process, as is known in the art. When reading data out of array 28, R/W unit 36 converts the storage values of memory cells 32 into digital samples having a resolution of one or more bits.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller that applies ECC to the data.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system. In some implementations, a single MSP 40 may be connected to multiple memory devices 24.

Memory cells 32 of array 28 are typically arranged in a grid having multiple rows and columns. Each cell 32 typically comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In a typical configuration of array 28, the gates of the transistors in each row are connected by word lines, and the sources of the transistors in each column are connected by bit lines. The array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Figures 2A, 2B:
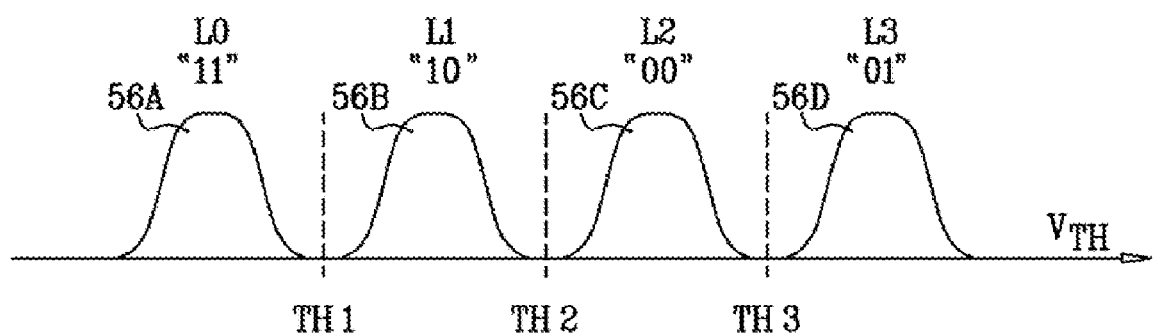
FIG. 2A is a graph showing threshold voltage distributions in a group of analog memory cells, in accordance with an embodiment of the present invention.
FIG. 2B is a diagram that schematically illustrates bit mapping and bit error events in a group of analog memory cells, in accordance with an embodiment of the present invention.

FIG. 2A is a graph showing threshold voltage distributions in a group of multi-level analog memory cells, in accordance with an embodiment of the present invention. In the present example, the cells comprise four-level MLC, each storing two data bits. The figure shows four threshold voltage distributions 56A . . . 56D, which correspond to four programming levels L0 . . . L3 that represent "11", "10", "00" and "01" data, respectively. In the example of FIG. 2A, the programming levels are spaced uniformly across the voltage axis.

The different data bits stored in a given cell are often referred to as having different significances. For example, when a four-level cell stores "10" data, the "1" bit may be regarded as the Most Significant Bit (MSB), and the "0" bit may be regarded as the Least Significant Bit (LSB). In the context of the present patent application, terms such as "bit significance," LSB and MSB are used for referring to certain bits of a cell or group of cells, and do not mean that some bits are more significant or important than others. Alternatively, other suitable conventions can be used. For example, the first bit may be referred to as "bit 0" and the second as "bit 1."

In some embodiments, a group of memory cells stores multiple memory pages, such that each page is mapped to a different bit. For example, in a given word line, the LSBs of the cells may store a certain memory page, while another page may be stored in the MSBs. Similar mapping arrangements may be carried out in eight-level cells or in cells that store any other number of bits.

The cells are programmed to the different levels by writing nominal threshold voltages to the cells, with each nominal threshold voltage corresponding to a certain programming level. Distributions 56A . . . 56D demonstrate that the actual threshold voltages of the cells typically vary from the nominal threshold voltages due to various inaccuracies and impairments, such as charge loss due to aging, cell wearing due to previous programming and erasure operations, cross-coupling interference, programming disturb and other effects.

Data is read from the memory cells by comparing their threshold voltages to read reference levels (also referred to as read thresholds). In the example of FIG. 1, three reference levels denoted TH1 . . . TH3 differentiate between the four programming levels L0 . . . L3. For example, when the voltage read from a given cell is higher than TH1 and lower than TH2, the cell is assumed to store the two data bits "10".

Error Events in Different MLC Bits

A read error occurs when the voltage read from a cell falls on the wrong side of a reference level, and is therefore associated with a wrong programming level. For example, the voltage of a cell that was originally programmed to store "10" data (i.e., programmed to level L1) may drift over time. If the voltage drifts and becomes, for example, lower than TH1, the cell will be read as storing "11" data. Thus, The MSB of this cell will be read correctly, but the LSB will have a read error.

Most read errors occur between adjacent programming levels. For this reason, the assignment of bit values to programming levels often uses "Gray coding," in which adjacent programming levels are assigned bit combinations that differ in only a single bit. When using Gray coding, a read error between adjacent programming levels causes only a single bit error. In FIG. 2A, for example, adjacent programming levels differ from one another in only a single bit.

When each cell stores multiple bits, different bits may have different Bit Error Rates (BER), since the number of possible error events that affect each bit may not be the same. Consider, for example, the scheme of FIG. 2A. In this scheme, a cell voltage falling on the wrong side of TH1 causes "11" data to be misread as "10" or vice versa. In either case, a read error in a read operation that uses TH1 causes an LSB error. Similarly, a read error in a read operation that uses TH2 will cause an MSB error, and a read error in a read operation that uses TH3 will cause an LSB error.

FIG. 2B is a diagram that schematically illustrates bit mapping and bit error events in the group of analog memory cells of FIG. 2A above, in accordance with an embodiment of the present invention. The table in FIG. 2B shows the bit value combinations mapped to levels L0 ... L3. The bit error events that are associated with the three read reference levels are marked by "E". As can be appreciated (considering only errors between adjacent programming levels), there are twice as many possible LSB errors as there are MSB errors.

Thus, assuming the data stored in the memory cells is distributed approximately evenly among the programming levels, and assuming that errors between adjacent programming levels are dominant, the BER of the LSB is approximately double the BER of the MSB. When different memory pages are stored in different MLC bits, the average BER may differ from one page to another.

Having a BER that differs from one cell group to another is often undesirable. For example, when the data in each page is encoded by an ECC, the ECC is typically designed based on the expected raw, uncoded BER of the cells. When different pages have different BERs, the ECC typically has to cope with the uncoded BER of the worse-performing pages.

Adjusting Bit-Specific Error Rates Using Non-Uniform Programming Levels

For a given pair of adjacent programming levels, the likelihood of read errors increases when the separation between the levels decreases, and vice versa. Therefore, the error rate associated with each pair of adjacent programming levels can be controlled by adjusting the separation between them.

Embodiments of the present invention provide methods and systems for controlling the BER of different MLC bits by programming the cells with programming levels that are spaced non-uniformly on the voltage axis. In some embodiments, the programming levels are spaced so that the BERs associated with the different bits are approximately equal to one another. Alternatively, the programming levels can be spaced so as to achieve different target BERs for the different bits, or in order to meet other kinds of conditions.

As noted above, each programming level represents a certain combination of bits and is represented by a nominal threshold voltage. In order to store a certain bit combination in a given cell, the R/W unit writes the nominal threshold voltage that corresponds to the desired bit combination, so as to program the cell to the appropriate programming level. The methods and systems described herein control the separation between programming levels by setting or adjusting the values of the nominal threshold voltages.

FIG. 3 is a flow chart that schematically illustrates a method for setting non-uniform programming levels in a group of analog memory cells, in accordance with an embodiment of the present invention. The method begins by determining bit-specific error rates of the different bits of the memory cells, at a BER estimation step 60. When each cell stores n data bits, n corresponding error rates are computed. The positions of the different programming levels are determined based on the bit-specific BERs, at a level setting step 64.

The bit-specific BERs can be calculated using any suitable method. For example, the error performance of the different bits can be estimated by simulation. Alternatively, when the threshold voltage distributions are known analytically, the bit-specific BERS can sometimes be computed or approximated analytically or numerically. Further alternatively, when the method is carried out during operation of the memory in a host system, the bit-specific error rates can be measured on training data or on actual data, such as by comparing the decoded data before and after ECC decoding.

FIG. 4 is a graph showing programming levels in a group of analog memory cells, in accordance with an embodiment of the present invention. The upper part of FIG. 4 shows the scheme of FIG. 2A above, in which the programming levels are spaced uniformly. As noted above with regard to FIGS. 2A and 2B, the BER of the LSB in this scheme is double the BER of the MSB. The lower part of FIG. 4 shows a scheme in which the programming levels are spaced non-uniformly in order to equalize the BERs of the LSB and MSB. Plots 68A ... 68B show the threshold voltage distributions of levels L0 ... L3 in the non-uniform scheme.

The separation between distributions 68B and 68C in the non-uniform scheme is smaller than the spacing between the corresponding distributions 56B and 56C of the uniform scheme. In other words, the error rate associated with reference level TH2 (which, as explained above, affects only the MSB) has been increased in the non-uniform scheme in comparison with the uniform scheme.

On the other hand, the separation between levels L0 and L1 and the separation between levels L2 and L3 is higher in the non-uniform scheme than in the uniform scheme. Therefore, the error rates associated with reference levels TH1 and TH3 (which, as explained above, affect only the LSB) have been reduced in the non-uniform scheme in comparison with the uniform scheme.

In total, the non-uniform scheme has a higher MSB BER and a lower LSB BER in comparison with the uniform scheme. Adjusting the level separations appropriately can equalize the two BER values.

FIG. 5 is a graph showing non-uniform programming levels in a group of analog memory cells, in accordance with another embodiment of the present invention. The figure demonstrates the process of equalizing the bit-specific BERs of the three different bits in a group of eight-level (3 bits/cell) MLC. In the present example, eight threshold voltage distributions 72A ... 72H correspond to eight programming levels L0 ... L7 that represent "000", "001", "011", "010", "110", "111", "101" and "100" data, respectively.

In the description that follows, the three bits stored in each cell are referred to as a MSB, a Central Significant Bit (CSB) and a LSB. The assignment of bit combinations to programming levels uses Gray coding, so that a read error between any given pair of adjacent levels affects only one of the three bits. The bits affected by each type of read error are given in the following table:

| Read error between levels | Affected bit |
| --- | --- |
| L0 and L1 | LSB |
| L1 and L2 | CSB |
| L2 and L3 | LSB |
| L3 and L4 | MSB |
| L4 and L5 | LSB |
| L5 and L6 | CSB |
| L6 and L7 | LSB |

Out of the seven possible error types (seven pairs of adjacent programming levels), four error types affect the LSB, two types affect the CSB, and only a single error type affects the MSB. Errors in the MSB are particularly rare, since six out of the eight programming levels have only adjacent levels that are mapped to the same MSB value. If these eight-level cells were to use uniformly-spaced programming levels, the ratio between the LSB BER, CSB BER and MSB BER would have been approximately 4:2:1.

In order to equalize the BERs of the three bits, the programming levels in the scheme of FIG. 5 are spaced non-uniformly. Adjacent programming levels whose errors affect the MSB (in this case, only levels L3 and L4) are set to a relatively small separation 76A. Adjacent programming levels whose errors affect the CSB (levels L1 and L2, and levels L5 and L6) are set to a larger separation 76B. The remaining separations are set to a still larger value.

Determining the relative level separations typically depends on the target BERs of the pages. In some embodiments, the target BERs are chosen such that after the relative level separations are determined, the level positions occupy the entire allowed voltage range. This technique maintains a similar voltage range as some conventional schemes that use uniformly-spaced programming levels. The worst-case BER is improved with respect to these uniform schemes, thus allowing the ECC scheme to use less redundancy bits.

Alternatively, the target BERs of the different pages can be chosen to be the same as the worst-case BER of the conventional schemes that use uniformly-spaced levels. In these embodiments, the ECC scheme typically uses a similar number of redundancy bits as the comparable uniform schemes. When using the methods described herein, however, the non-uniform programming levels occupy a smaller voltage range than the range occupied by the comparable uniform scheme. The use of a smaller voltage range can be a significant advantage, since some memory technologies have limits on the allowed voltage range. Additionally, some impairment mechanisms (e.g. program disturb) are more severe when the voltage range is larger.

The following example demonstrates the use of non-uniform programming levels for decreasing the voltage range. Consider a conventional uniformly-spaced scheme, which is used as a reference, in which the BER of the worst-case page is $1.3 \cdot 10^{-3}$. The reference scheme is a 3 bits/cell scheme, which comprises eight voltage levels and uses Gray mapping, as shown in FIG. 5. The eight level distributions are assumed to be Gaussian distributions having a variance of unity. For a uniform level spacing of $\Delta$ volts, the BERs of the LSB, CSB and MSB pages are $Q(\Delta/2)$, $Q(\Delta/2)/2$ and $Q(\Delta/2)/4$, respectively, wherein $Q(x)$ is defined as $$Q(x) = 1/\sqrt{2\pi} \int_x^\infty e^{-x^2/2} dx.$$

The LSB page in the present example has the worst BER. Solving $Q(\Delta/2)=1.3 \cdot 10^{-3}$, we get $\Delta=6$. Thus, the voltage range between the lowest and highest voltage level positions is $7*6=42$. On the other hand, when using the non-uniform spacing schemes described herein, a spacing of 6 is used only for the levels that affect the LSB page, i.e., for the spacing between levels L0-L1, L2-L3, L4-L5 and L6-L7. For the levels that affect the CSB page, the level separations are determined by solving $Q(\Delta/2)/2=1.3 \cdot 10^{-3}$, which gives $\Delta=5.6$. This spacing applies to the spacing between levels L1-L2 and L5-L6. Finally, for the levels that affect the MSB, the level separations are determined by solving $Q(\Delta/2)/4=1.3 \cdot 10^{-3}$, which gives $\Delta=5.12$. This spacing applies only to the spacing between levels L3-L4. Using the three different level separations, the voltage range between the lowest and highest voltage level positions is given by $4*6+2*5.6+5.12=40.32$. In comparison with the reference uniformly-spaced scheme, the non-uniform scheme can reduce the voltage range from 42 to 40.32, i.e., by 4%, using the same ECC and for the same target BER.

Other conditions that use the allowed voltage range as a constraint can also be used. Note that the calculations given above assume that all programming levels have approximately the same distribution width. If different levels have different distribution widths, the ratios among the BERs of the LSB, CSB and MSB pages (for uniform level spacing) may vary from the 4:2:1 ratios, as determined by the actual level distributions.

The methods and systems described herein can be used not only for equalizing the different bit-specific BERs but to achieve other criteria, as well. In general, the separation between programming levels can be set according to various other conditions that are defined in terms of the bit-specific error rates. For example, a certain condition may state that each bit-specific BER should not exceed a respective target error rate. The target error rates may differ from one another. Such a condition may be advantageous, for example, when different pages store different types of data having different reliability requirements.

In some embodiments, the ECC decoding process decodes the ECC by processing soft metrics. Methods for soft ECC decoding in memory devices are described, for example, in PCT Application WO 2007/132457, entitled "Combined Distortion Estimation and Error Correction Coding for Memory Devices, filed May 10, 2007, whose disclosure is incorporated herein by reference. When soft ECC decoding is used, equalizing the BER before ECC decoding (referred to as pre-ECC BER) does not necessarily produce optimal programming level positions. In these scenarios, choosing the programming level positions such that the post-ECC BER (i.e., the BER after soft ECC decoding) will be equal for all pages is sometimes advantageous. Thus, the bit-specific error rates and the target condition defined over these error rates may be specified in terms of pre-ECC BER, post-ECC BER, or both. Another possible criterion is to equalize the Shannon capacity for all pages.

The examples given above refer to Gray-coded configurations, in which the level spacing can be adjusted separately for each bit. However, the methods and systems described herein can also be used in configurations that do not use Gray coding. In these cases, the level separations are typically determined jointly for a number of bits, analytically or by simulation. For high BER values, the level positions should also take into account errors among non-adjacent programming levels, and the level separations should then be designed jointly, in a similar manner to the non-Gray case.

The methods described herein may be applied a-priori, i.e., during a design phase of the memory. Additionally or alternatively, the spacing between programming levels can be adjusted during operation of the memory device in a host system, such as by the MSP or by a suitable memory controller. Thus, the separation between programming levels can track changes in voltage distributions and/or data characteristics that occur throughout the lifetime of the memory.

The methods described herein can be combined with distortion cancellation. In some embodiments, the MSP applies techniques for reducing or canceling various types of distortion in the cell voltages, such as cross-coupling, disturb noise or any other kind of distortion. Distortion cancellation techniques are described, for example, in PCT Application WO 2007/132457, cited above, PCT Application WO 2007/132453, entitled "Distortion Estimation and Cancellation in Memory Devices," filed May 10, 2007, and PCT Application WO 2007/132452, entitled "Reducing Programming Error in Memory Devices," filed May 10, 2007, whose disclosures are incorporated herein by reference. When applying distortion cancellation, the MSP may determine the positions of the programming levels such that the desired criterion (e.g. equal BER for MSB, CSB, and LSB pages) is satisfied after distortion cancellation has been performed.

When some residual distortion is not canceled, the programming level positions are typically chosen such that the desired criterion (e.g. equal BER for all pages) is satisfied in the presence of the remaining distortion. For example, in some. NAND Flash memory devices, the voltage levels tend to shift over time due to leakage of electric charge from the floating gates of the cells. Different programming levels may suffer from different amounts of shift. In some embodiments, the level positions are designed such that at the worst expected scenario, after the levels have already shifted, the desired criterion is satisfied.

In some embodiments, such as when the MSP applies soft decoding and/or distortion cancellation, the memory cells are typically read more than once using different reference levels. In these embodiments, the number of re-read operations that are applied to a certain page may depend on the separation between the programming levels that affect this page. For example, a larger separation between programming levels may enable the MSP to reduce the number of re-read operations, and vice versa. The number of re-read operations determines the achievable read throughput. Therefore, in some embodiments, the condition that determines the programming level positions may take the read throughput into account. For example, the programming level positions may be set so that a certain minimum read throughput is maintained while still meeting the target BERs.

Although the embodiments described herein refer to four-level and eight-level MLC, the methods and systems described herein can be used in any other type of MLC storing any number of bits. Although the embodiments described herein mainly address data storage in solid-state memory devices, the principles of the present invention can also be used for data storage in other types of storage devices, such as Hard Disk Drives (HDD).

Figure 6:
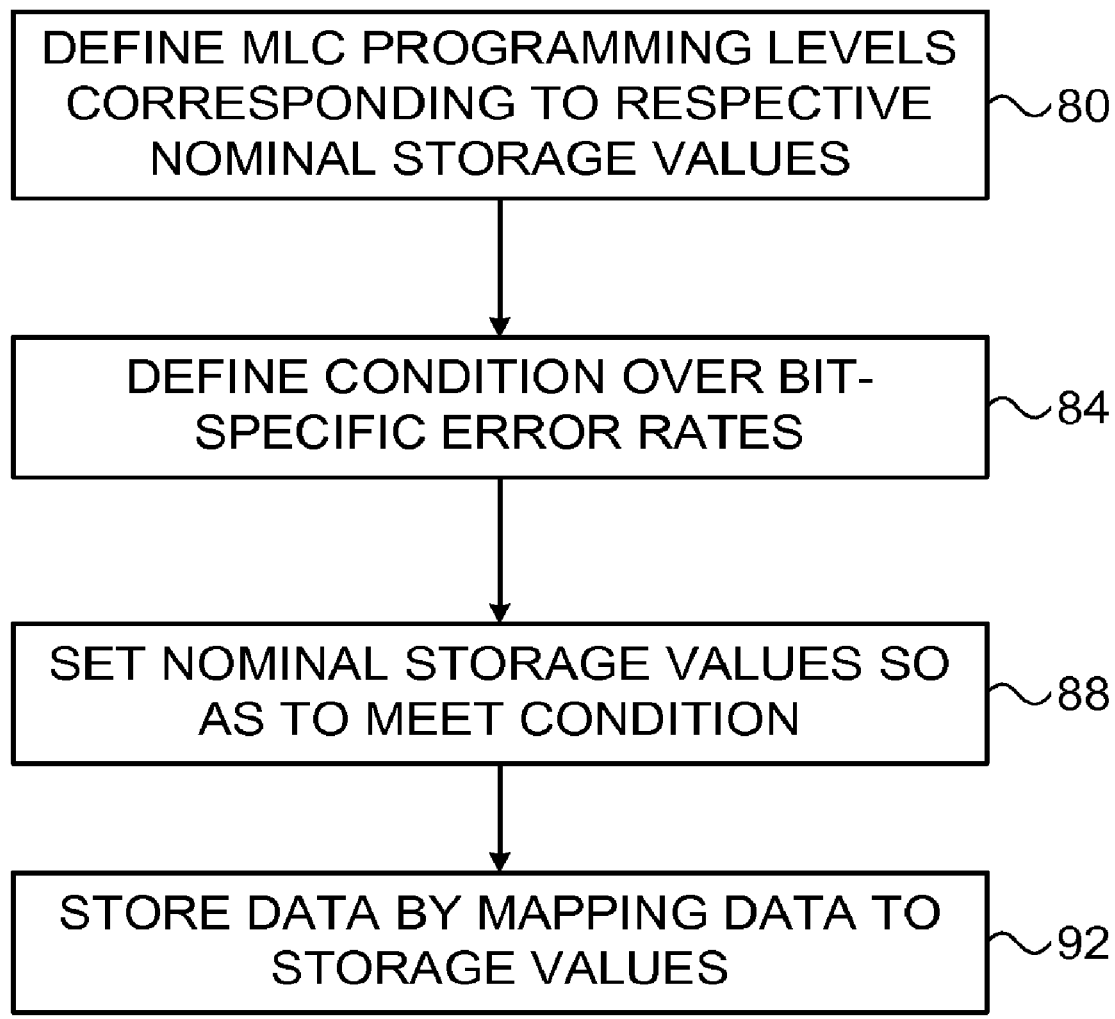
FIG. 6 is a flow chart that schematically illustrates a method for setting non-uniform programming levels in a group of analog memory cells, in accordance with an embodiment of the present invention.

FIG. 6 is a flow chart that schematically illustrates a method for setting non-uniform programming levels in a group of multi-level analog memory cells, in accordance with an embodiment of the present invention. The method begins by defining a set of programming levels, which correspond to respective nominal storage values, at a level definition step 80. A condition is defined over the respective bit-specific error rates of the MLC bits, at a condition definition step 84. The nominal storage values of the programming levels are set so as to match the above-defined condition, at a nominal storage value setting step 88. MSP 40 stores data in the memory cells of the group in accordance with the nominal storage values that were set at step 88 above, at a programming step 92.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for storing data in a memory that includes a plurality of analog memory cells, the method comprising:

defining a set of programming levels that represent respective combinations of at least first and second bits and are represented by respective nominal storage values to be programmed in the memory by a processor;

storing the data in the memory using the processor by mapping the data to storage values selected from among the nominal storage values and writing the storage values to the memory cells;

defining a condition over two or more bit-specific error rates applicable respectively to at least the first and second bits, wherein the bit-specific error rates comprise a first bit-specific error rate computed over the data stored by the first bits in the memory cells and a second bit-specific error rate computed, separately from the first bit-specific error rate, over the data stored by the second bits in the memory cells; and setting the nominal storage values used by the processor based on the bit-specific error rates so as to meet the condition.

2. The method according to claim 1, wherein the condition states that the two or more bit-specific error rates are equal to one another.

3. The method according to claim 1, wherein the condition states that the two or more bit-specific error rates do not exceed respective two or more target error rates.

4. The method according to claim 1, wherein setting the nominal storage values comprises maximizing a spacing among the nominal storage values within a maximum allowed range of the storage values.

5. The method according to claim 1, wherein setting the nominal storage values comprises minimizing a range occupied by the storage values.

6. The method according to claim 1, wherein setting the nominal storage values comprises estimating the bit-specific error rates for an initial setting of the nominal storage values, evaluating the condition responsively to the estimated bit-specific error rates, and modifying the nominal storage values so as to meet the condition.

7. The method according to claim 6, wherein estimating the bit-specific error rates comprises reading second storage values from the cells, reconstructing the data by processing the read second storage values, detecting bit errors in the reconstructed data and calculating the bit-specific error rates responsively to the detected bit errors.

8. The method according to claim 7, wherein storing the data comprises encoding the data with an Error Correction Code (ECC), wherein reconstructing the data comprises decoding the ECC, and wherein detecting the bit errors comprises comparing the reconstructed data before decoding the ECC with the reconstructed data after decoding the ECC.

9. The method according to claim 6, wherein, when one of the bit-specific error rates is to be increased with respect to the other bit-specific error rates in order to meet the condition, modifying the nominal storage values comprises identifying a pair of the programming levels, such that a read error between the identified pair of the programming levels contributes to the one of the bit-specific error rates, and reducing a spacing between a pair of the nominal storage values that are associated with the identified pair of the programming levels.

10. The method according to claim 6, wherein, when one of the bit-specific error rates is to be reduced with respect to the other bit-specific error rates in order to meet the condition, modifying the nominal storage values comprises identifying a pair of the programming levels, such that a read error between the identified pair of the programming levels contributes to the one of the bit-specific error rates, and increasing a spacing between a pair of the nominal storage values that are associated with the identified pair of the programming levels.

11. The method according to claim 6, wherein estimating the bit-specific error rates, evaluating the condition and modifying the nominal storage values comprise running a computerized simulation that simulates the memory and produces the nominal storage values.

12. The method according to claim 6, wherein estimating the bit-specific error rates, evaluating the condition and modifying the nominal storage values are performed when the memory is operating in a host system.

13. The method according to claim 1, wherein storing the data comprises encoding the data with an Error Correction Code (ECC), and wherein the bit-specific error rates comprise at least one error rate type selected from a group of types consisting of a pre-ECC error rate measured before decoding the ECC and a post-ECC error rate measured after decoding the ECC.

14. The method according to claim 1, wherein the data is partitioned into memory pages, and wherein each of the at least first and second bits stores a respective different memory page.

15. The method according to claim 1, and comprising reading second storage values from the cells and canceling a distortion in at least some of the second storage values, wherein setting the nominal storage values comprises setting the nominal storage values so as to meet the condition with respect to the second storage values in which the distortion was canceled.

16. The method according to claim 1, wherein the condition is further defined over a throughput of reading the data from the memory, and wherein setting the nominal storage values comprises setting the values responsively to the throughput.

17. A data storage apparatus, comprising:
a memory, which comprises a plurality of analog memory cells;
read/write (R/W) circuitry, which is coupled to the memory and is configured to accept a definition of a set of programming levels that represent respective combinations of at least first and second bits and are represented by respective nominal storage values, and to store the data in the memory by mapping the data to storage values selected from among the nominal storage values and writing the storage values to the analog memory cells; and
a processor, which is connected to the R/W circuitry and is configured to define a condition over two or more bit-specific error rates applicable respectively to at least the first and second bits, wherein the bit-specific error rates comprise a first bit-specific error rate computed over the data stored by the first bits in the memory cells and a second bit-specific error rate computed, separately from the first bit-specific error rate, over the data stored by the second bits in the memory cells, and to set the nominal storage values based on the bit-specific error rates so as to meet the condition.

18. The apparatus according to claim 17, wherein the condition states that the two or more bit-specific error rates are equal to one another.

19. The apparatus according to claim 17, wherein the condition states that the two or more bit-specific error rates do not exceed respective two or more target error rates.

20. The apparatus according to claim 17, wherein the processor is configured to maximize a spacing among the nominal storage values within a maximum allowed range of the storage values.

21. The apparatus according to claim 17, wherein the processor is configured to set the nominal storage values so as to minimize a range occupied by the storage values.

22. The apparatus according to claim 17, wherein the processor is configured to estimate the bit-specific error rates for an initial setting of the nominal storage values, to evaluate the condition responsively to the estimated bit-specific error rates, and to modify the nominal storage values so as to meet the condition.

23. The apparatus according to claim 22, wherein the processor is configured to read second storage values from the cells, to reconstruct the data by processing the read second storage values, to detect bit errors in the reconstructed data and to calculate the bit-specific error rates responsively to the detected bit errors.

24. The apparatus according to claim 23, wherein the processor is configured to encode the stored data with an Error Correction Code (ECC), to decode the ECC when reconstructing the data, and to detect the bit errors by comparing the reconstructed data before decoding the ECC with the reconstructed data after decoding the ECC.

25. The apparatus according to claim 22, wherein, when one of the bit-specific error rates is to be increased with respect to the other bit-specific error rates in order to meet the condition, the processor is configured to identify a pair of the programming levels, such that a read error between the identified pair of the programming levels contributes to the one of the bit-specific error rates, and to reduce a spacing between a pair of the nominal storage values that are associated with the identified pair of the programming levels.

26. The apparatus according to claim 22, wherein, when one of the bit-specific error rates is to be reduced with respect to the other bit-specific error rates in order to meet the condition, the processor is configured to identify a pair of the programming levels, such that a read error between the identified pair of the programming levels contributes to the one of the bit-specific error rates, and to increase a spacing between a pair of the nominal storage values that are associated with the identified pair of the programming levels.

27. The apparatus according to claim 22, wherein the processor is configured to estimate the bit-specific error rates, evaluate the condition and modify the nominal storage values by running a computerized simulation that simulates the memory and produces the nominal storage values.

28. The apparatus according to claim 22, wherein the processor is configured to estimate the bit-specific error rates, evaluate the condition and modify the nominal storage values when the memory is operating in a host system.

29. The apparatus according to claim 17, wherein the processor is configured to encode the data with an Error Correction Code (ECC), and wherein the bit-specific error rates comprise at least one error rate type selected from a group of types consisting of a pre-ECC error rate measured before decoding the ECC and a post-ECC error rate measured after decoding the ECC.

30. The apparatus according to claim 17, wherein the data is partitioned into memory pages, and wherein the processor is configured to store a respective different memory page in each of the at least first and second bits.

31. The apparatus according to claim 17, wherein the processor is configured to read second storage values from the cells, to cancel a distortion in at least some of the second storage values, and to set the nominal storage values so as to meet the condition with respect to the second storage values in which the distortion was canceled.

32. The apparatus according to claim 17, wherein the processor is configured to define the condition over a throughput of reading the data from the memory, and to set the nominal storage values responsively to the throughput.

33. A data storage apparatus, comprising:
an interface, which is coupled to communicate with a memory that includes a plurality of analog memory cells; and
a processor, which is connected to the interface and is configured to define a set of programming levels that represent respective combinations of at least first and second bits and are represented by respective nominal storage values, to store the data in the memory by mapping the data to storage values selected from among the nominal storage values and writing the storage values to the analog memory cells, to define a condition over two or more bit-specific error rates applicable respectively to at least the first and second bits, wherein the bit-specific error rates comprise a first bit-specific error rate computed over the data stored by the first bits in the analog memory cells and a second bit-specific error rate computed, separately from the first bit-specific error rate, over the data stored by the second bits in the analog memory cells, and to set the nominal storage values based on the bit-specific error rates so as to meet the condition.

34. A memory, comprising:
a plurality of analog memory cells; and
read/write (R/W) circuitry, which is coupled to the analog memory cells and is configured to accept a set of nominal storage values, which correspond to respective programming levels representing respective combinations of at least first and second bits, and to store data in the memory by mapping the data to storage values selected from among the nominal storage values and writing the storage values to the analog memory cells, wherein the nominal storage values meet a condition, which is defined over two or more bit-specific error rates applicable respectively to at least the first and second bits, wherein the bit-specific error rates comprise a first bit-specific error rate computed over the data stored by the first bits in the analog memory cells and a second bit-specific error rate computed, separately from the first bit-specific error rate, over the data stored by the second bits in the analog memory cells.

* * * * *